(12) United States Patent
Lin

(10) Patent No.: US 12,225,683 B2
(45) Date of Patent: Feb. 11, 2025

(54) THERMAL MODULE

(71) Applicant: ALPHA NETWORKS INC., Hsinchu (TW)

(72) Inventor: Tzu-Chih Lin, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 273 days.

(21) Appl. No.: 17/863,209

(22) Filed: Jul. 12, 2022

(65) Prior Publication Data

US 2023/0328917 A1 Oct. 12, 2023

(30) Foreign Application Priority Data

Apr. 12, 2022 (TW) .................................. 111113909

(51) Int. Cl.
*H05K 7/20* (2006.01)

(52) U.S. Cl.
CPC ................................ *H05K 7/20172* (2013.01)

(58) Field of Classification Search
CPC ................................................. H05K 7/20172
See application file for complete search history.

(56) References Cited

U.S. PATENT DOCUMENTS

| 7,463,487 B2 * | 12/2008 | Kim ................... H05K 7/20972 |
| | | 345/905 |
| 2020/0284267 A1 * | 9/2020 | Kawamura ............. F04D 17/04 |

FOREIGN PATENT DOCUMENTS

| CN | 100388472 C | | 5/2008 |
| CN | 208935028 U | * | 6/2019 |
| CN | 215292974 U | | 12/2021 |
| CN | 216009023 U | | 3/2022 |
| JP | 2010-185443 A | | 8/2010 |
| TW | M617451 U | | 9/2021 |

OTHER PUBLICATIONS

English translation of CN_208935028_U_I (Year: 2019).*
Taiwanese Search Report for Taiwanese Application No. 111113909, dated Sep. 2, 2022, with English translation.

* cited by examiner

*Primary Examiner* — Mukundbhai G Patel
(74) *Attorney, Agent, or Firm* — Birch, Stewart, Kolasch & Birch, LLP

(57) ABSTRACT

A thermal module for being disposed in an electronic device comprises a driving device and at least one thermal device. The driving device includes a driving member and a driven member which are connected together, wherein the driving member is adapted to drive the driven member to operate. The at least one thermal device includes a fan, wherein two opposite ends of the fan respectively have a mating portion and a connecting portion. The mating portion is adapted to be connected to the driven member, so that the driving member drives the driven member to drive the fan to rotate. The connecting portion of the fan is adapted to be connected to the mating portion of a fan of another thermal device, so that when the driving member drives the fan to rotate, the fan drives the fan of the another thermal device to rotate.

9 Claims, 13 Drawing Sheets

THERMAL MODULE

BACKGROUND OF THE INVENTION

Technical Field

The present invention relates generally to a thermal module, and more particularly to a thermal module with fans.

Description of Related Art

Conventionally, when electronic devices operate intensively, a large amount of heat energy would be generated, especially for electronic communication devices which usually operate for a long time, such as routers and switches. As a result, the accumulation of waste heat is severe.

In order to solve the aforementioned problem, a thermal device such as a heat sink is generally disposed on an electronic device to guide a heat energy of the electronic device out of the electronic device. With a forced convection provided by a fan, an air flow passing through the heat sink is increased, and the air flow carrying the heat energy could be brought out of the electronic device, achieving a cooling effect. Besides, cooling efficiency could be increased by increasing the number of the fans.

Typically, each of the fans drives a plurality of fan blades to rotate via a motor to produce the air flow. However, when the number of the fans is increased, noise and energy consumption also increase. Besides, the increased number of the fans is inconducive to reducing the overall volume of the electronic device. Therefore, how to provide a thermal module, which could increase the cooling efficiency and reduce the energy consumption and the noise, has become a major issue in the industry.

BRIEF SUMMARY OF THE INVENTION

In view of the above, the primary objective of the present invention is to provide a thermal module, which could increase the cooling efficiency and reduce the energy consumption, the volume, and the noise The present invention provides a thermal module for being disposed in an electronic device, comprising a driving device and at least one thermal device. The driving device comprises a driving member and a driven member which are connected together, wherein the driving member is adapted to drive the driven member to operate. The at least one thermal device comprises a fan. Two opposite ends of the fan respectively have a mating portion and a connecting portion. The mating portion is adapted to be connected to the driven member, so that the driving member drives the driven member to drive the fan to rotate; wherein the connecting portion of the fan is adapted to be connected to the mating portion of a fan of another thermal device, so that when the driving member drives the fan of the at least one thermal device to rotate, the fan of the at least one thermal device drives the fan of the another thermal device to rotate.

With the aforementioned design, the fan of a plurality of the thermal devices could be driven to rotate by simply one driving member; increasing the cooling efficiency. Besides, when installing a plurality of thermal devices, compared with the conventional thermal device in which one driving element drives one fan, the thermal module of the present invention could effectively reduce the noise of the driving member during operating, and the energy consumption and the overall volume of the thermal module could also be reduced at the same time.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
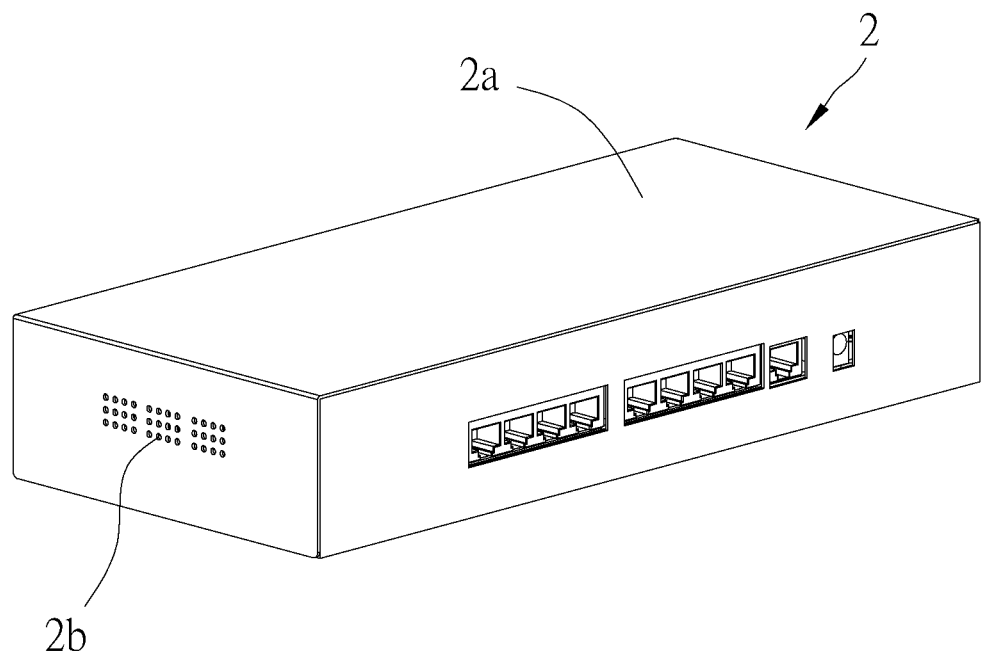
FIG. 1 is a perspective view of the electronic device according to an embodiment of the present invention.
Figure 2:
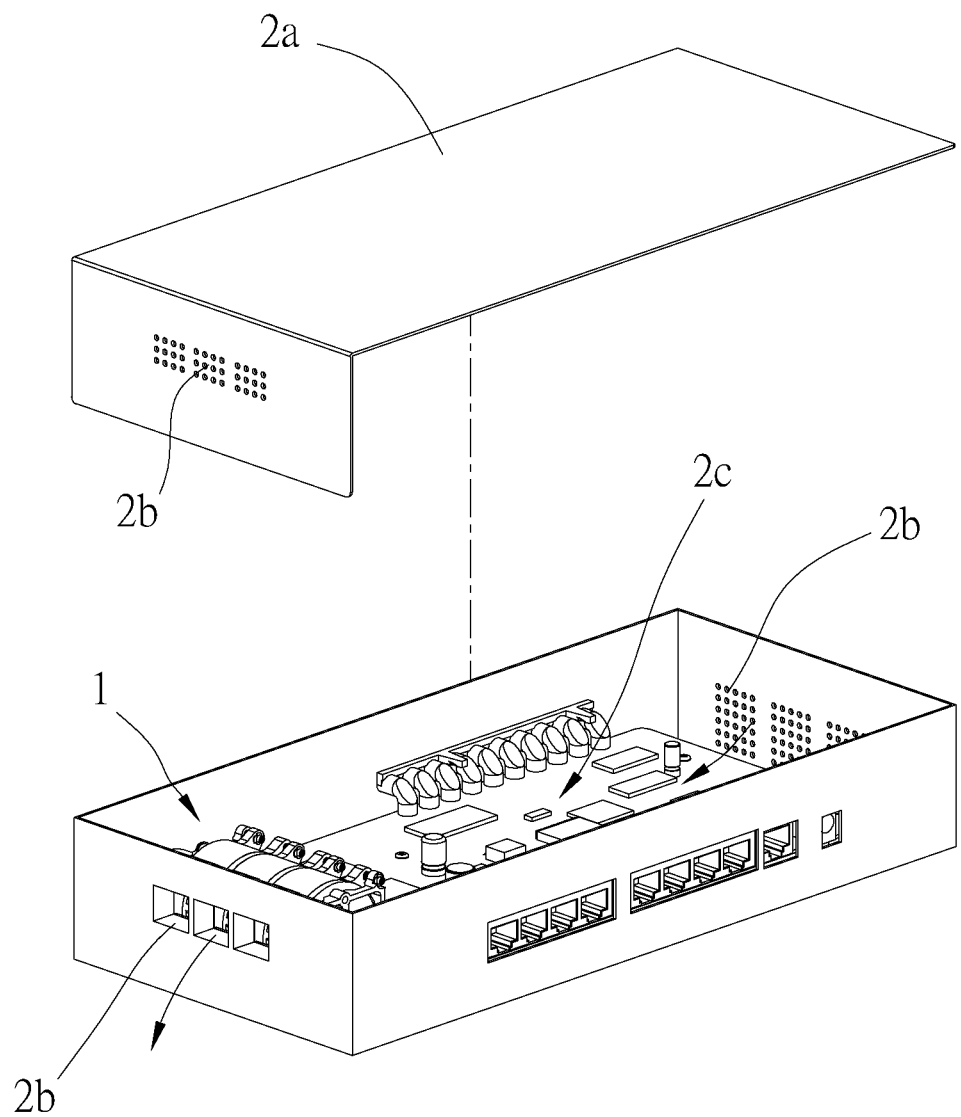
FIG. 2 is a partially exploded view of the electronic device according to the embodiment of the present invention.

A thermal module 1 disposed in an electronic device 2 according to an embodiment of the present invention is illustrated in FIG. 1 and FIG. 2. The electronic device 2 could be an electronic communication device, such as a router, a switch, or an electronic device requiring cooling. The electronic device 2 includes an outer case 2a, wherein two opposite sides of the outer case 2a respectively have a plurality of through holes 2b communicating an inside and an outside of the outer case 2a. The thermal module 1 is disposed in the outer case 2a and is located on a side of a plurality of electronic components 2c. In this way, a gas from outside of the outer case 2a could be guided by the thermal module 1 to enter the outer case 2a through the through holes 2b on a side of the outer case 2a, and pass through a surface of the electronic components 2c, and exit through the through holes 2b on another side of the outer case 2a, so that an air flow carrying a heat energy could be removed from the electronic device 2, achieving cooling effect.

Figure 6:
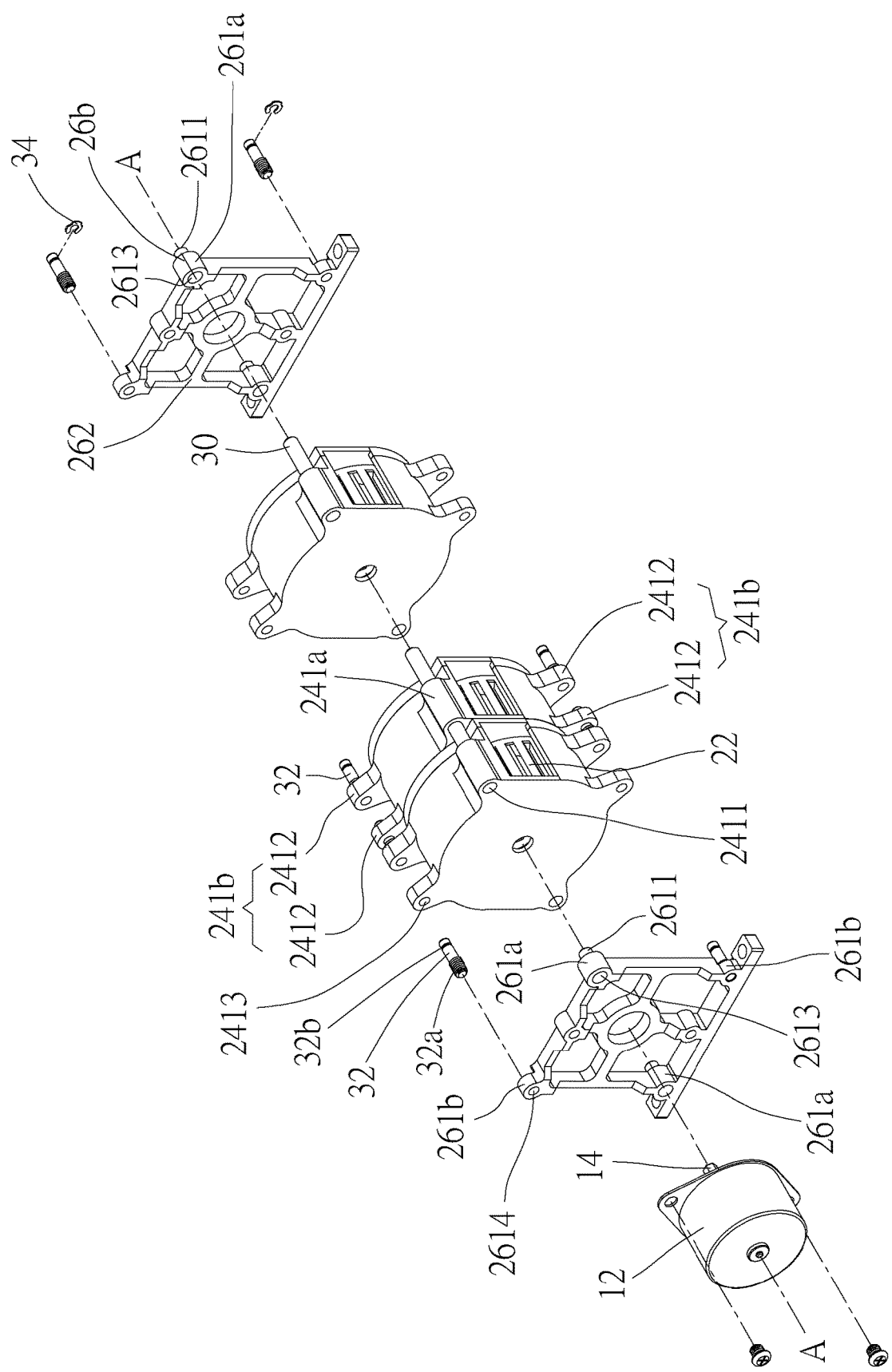
FIG. 6 is a partially exploded view of the thermal module according to the embodiment of the present invention.
Figure 7:
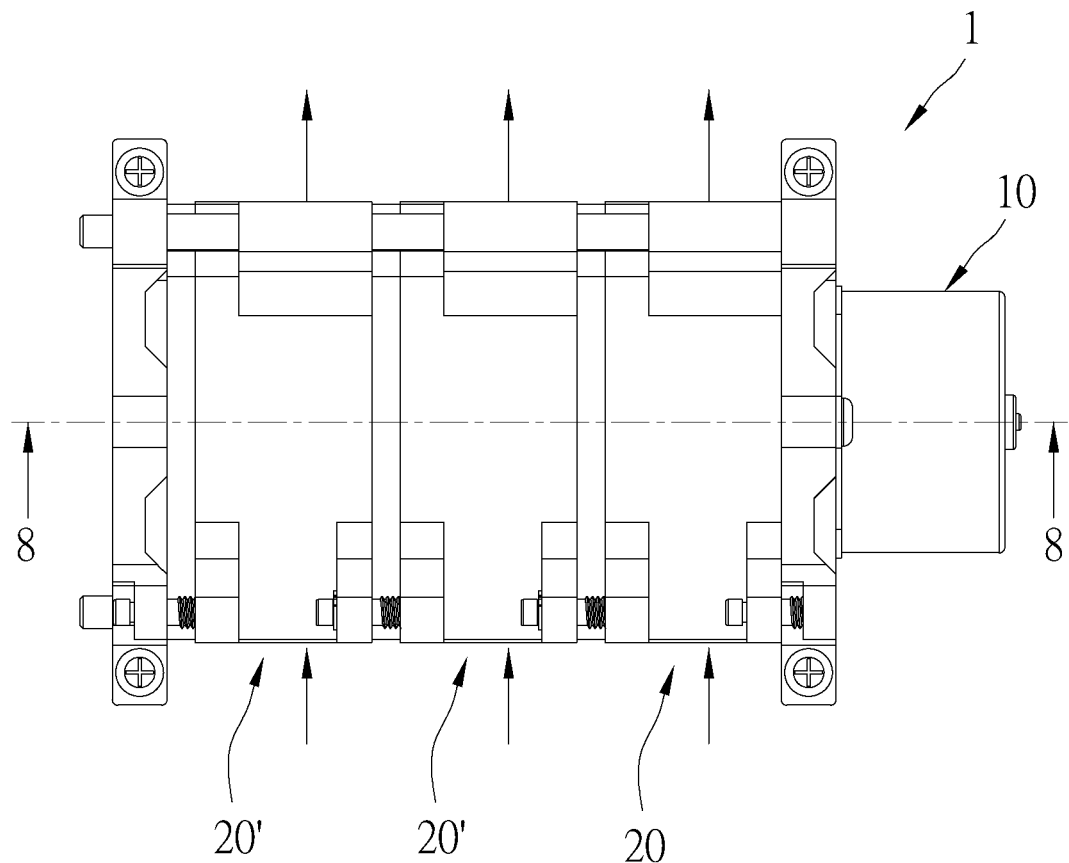
FIG. 7 is a top view of the thermal module according to the embodiment of the present invention.
Figure 8:
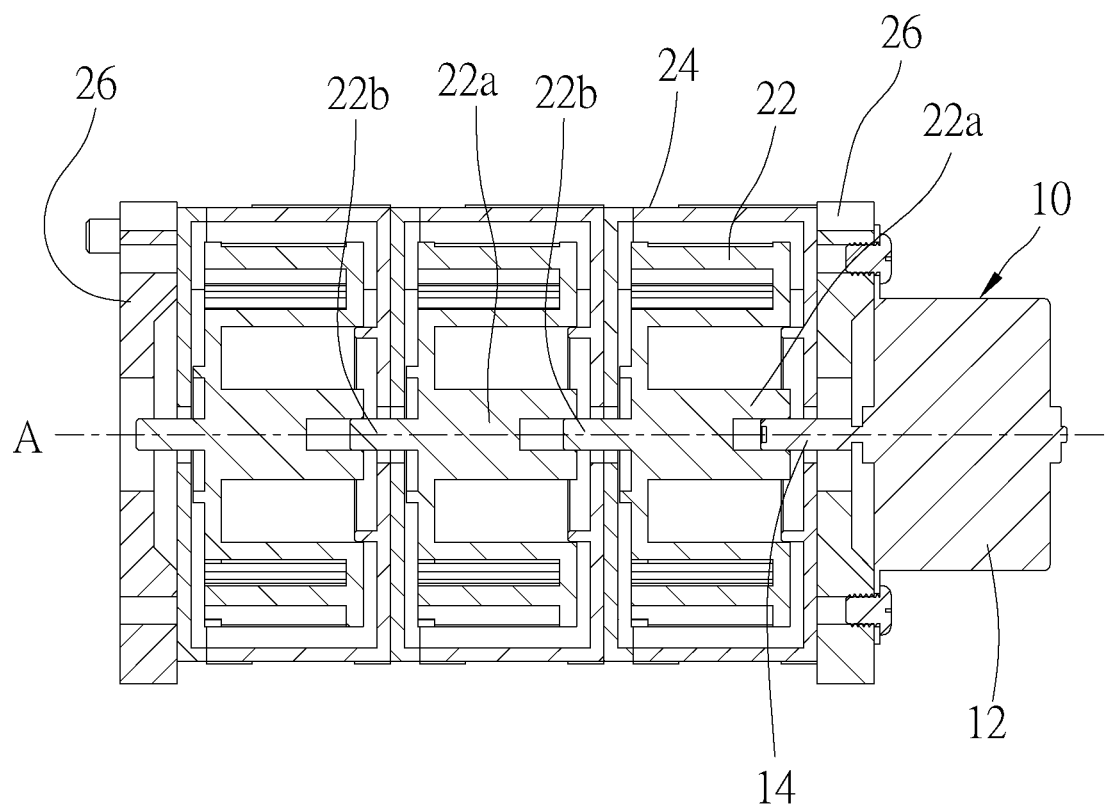
FIG. 8 is a sectional view along the 8-8 line in FIG. 7.
Figure 9:
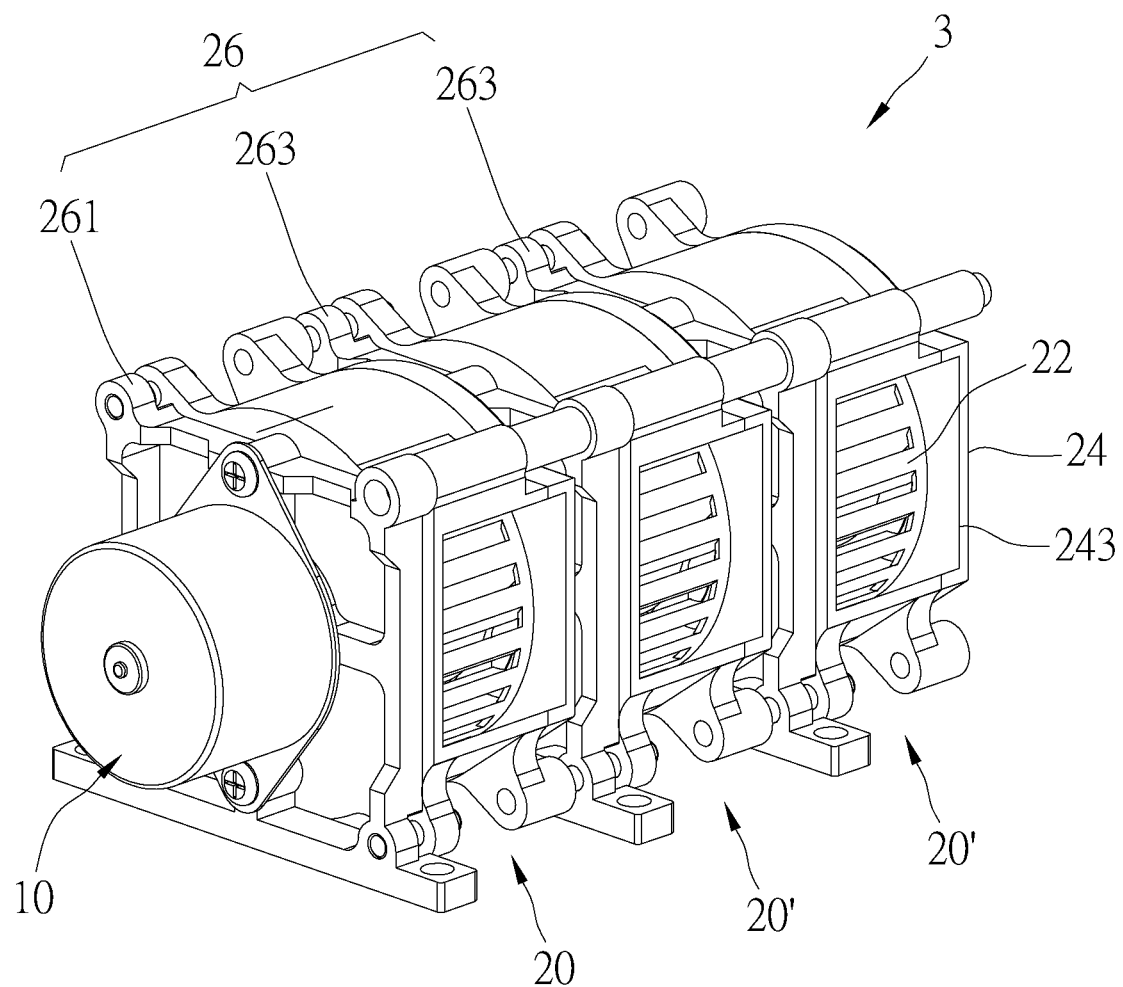
FIG. 9 is a perspective view of the thermal module according to another embodiment of the present invention.
Figure 10:
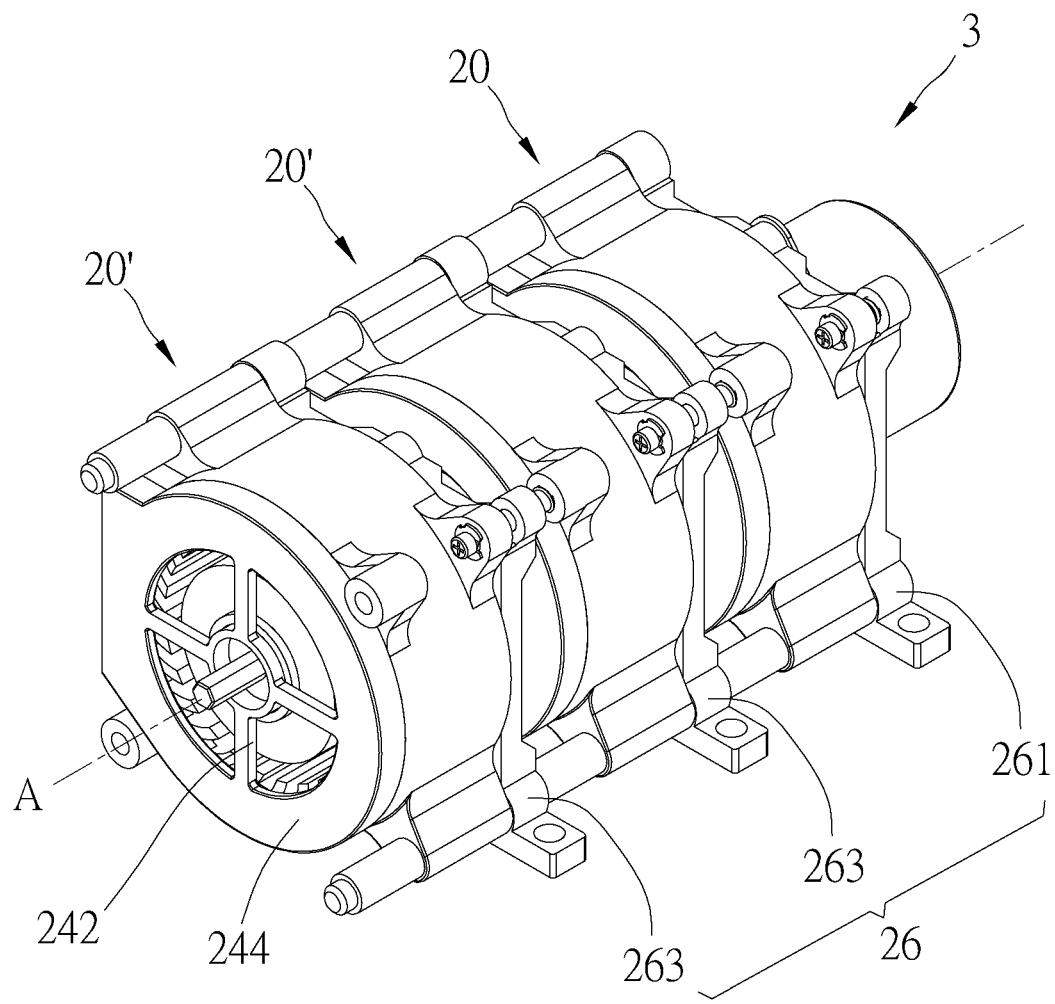
FIG. 10 is a perspective view of the thermal module according to the another embodiment of the present invention seen from another direction.
Figure 11:
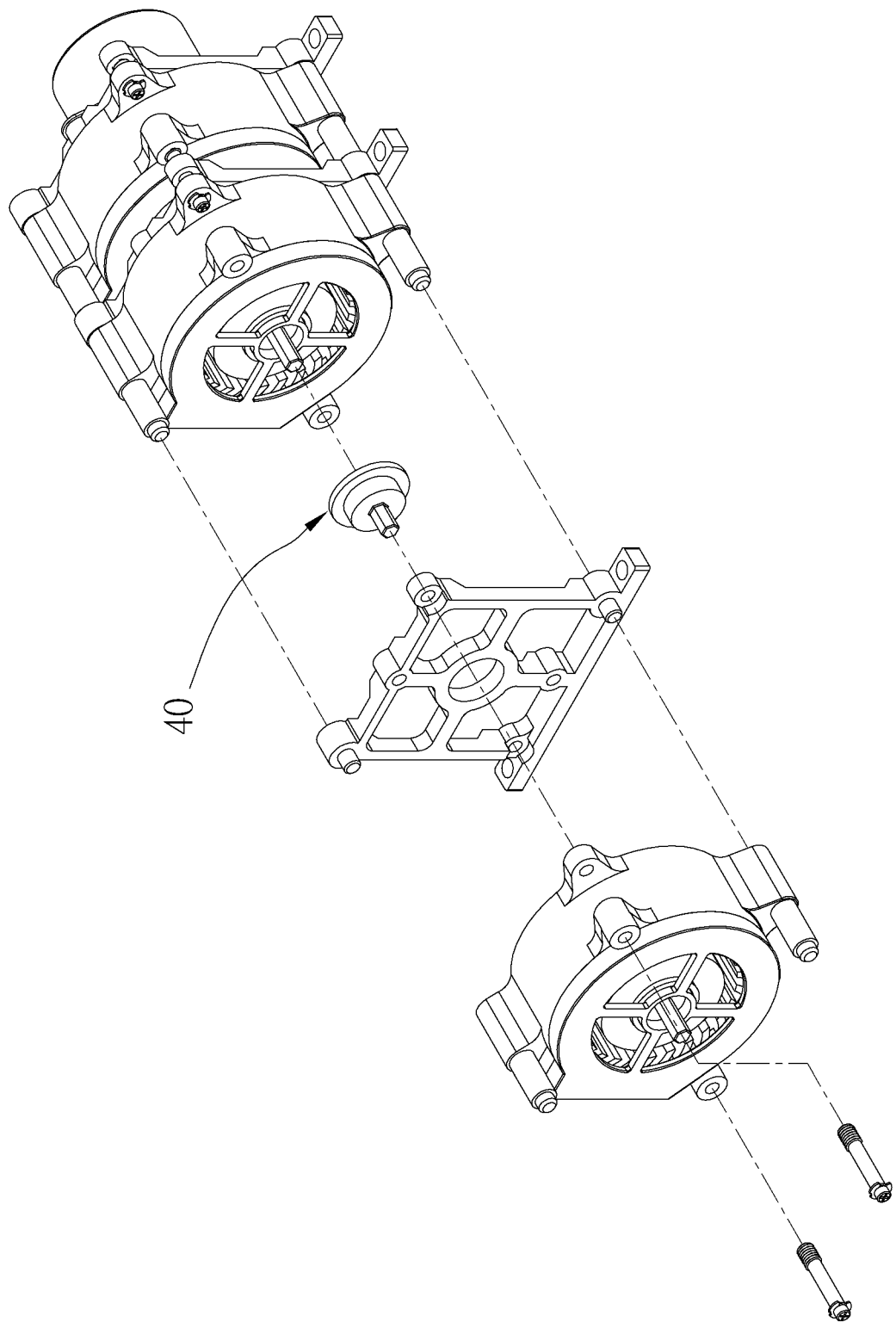
FIG. 11 is a partially exploded view of the thermal module according to the another embodiment of the present invention.
Figure 12:
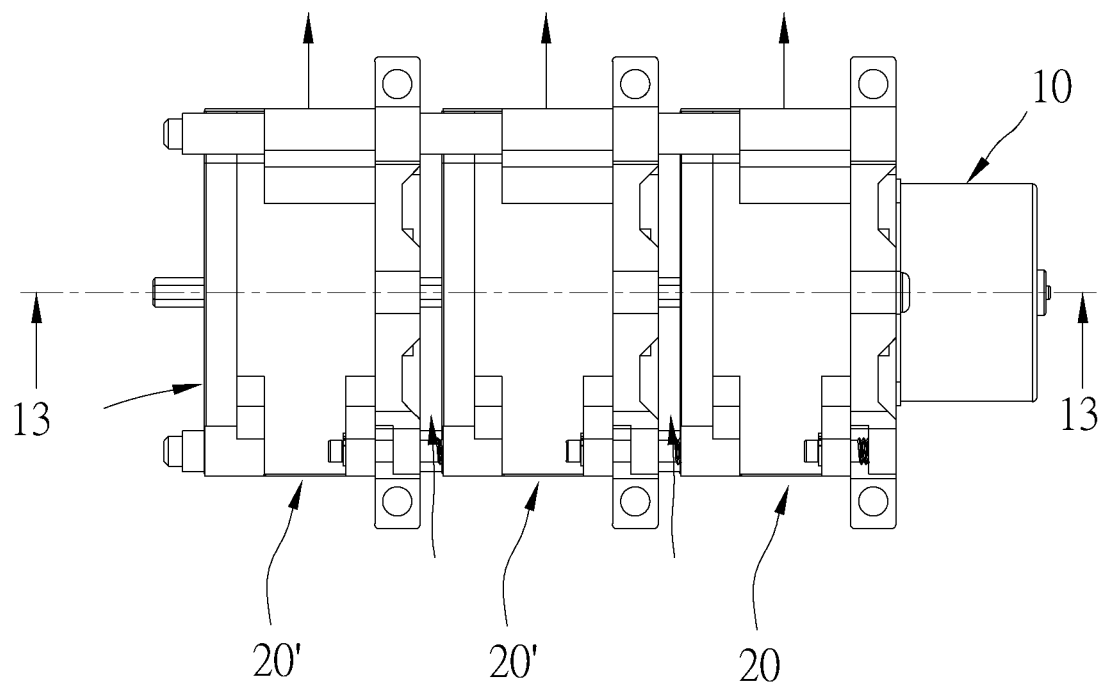
FIG. 12 is a top view of the thermal module according to the another embodiment of the present invention.
Figure 13:
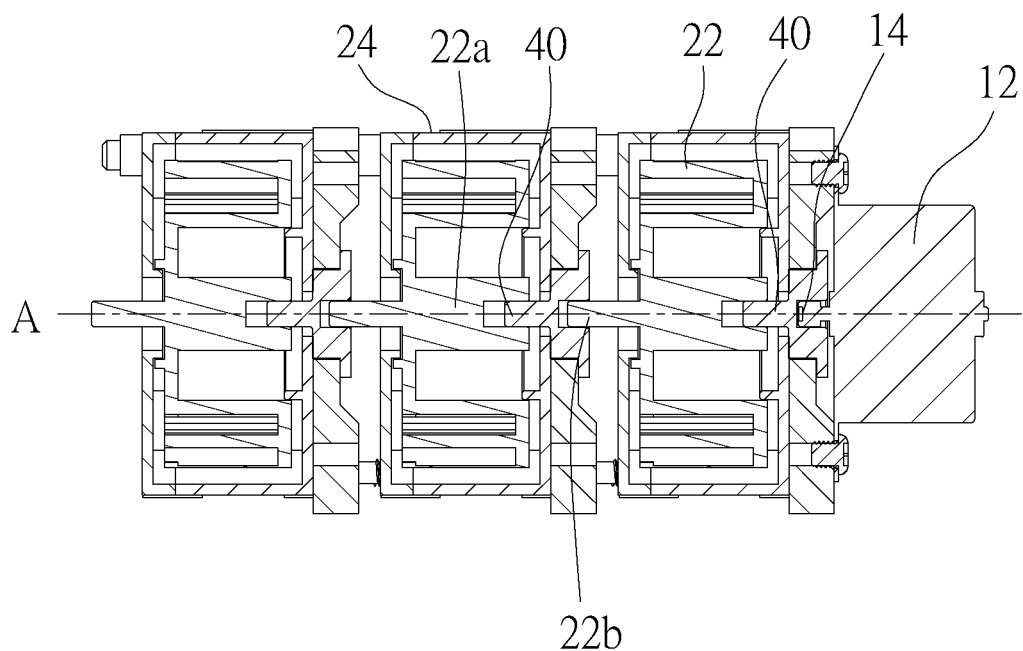
FIG. 13 is a sectional view along the 13-13 line in FIG. 12.

As shown in FIG. 3 to FIG. 8, the thermal module 1 includes a driving device 10 and at least one thermal device 20. The driving device 10 includes a driving member 12 and a driven member 14 which are connected together, wherein the driving member 12 is adapted to drive the driven member 14 to operate. Each of the thermal devices 20 includes a fan 22, wherein a mating portion 22a and a connecting portion 22b are provided respectively on two opposite ends of the fan 22 (as shown in FIG. 8). The mating portion 22a is adapted to be connected to the driven member 14, so that the driving member 12 could drive the driven member 14 to drive the fan 22 to rotate. Besides, the connecting portion 22b of the fan 22 is adapted to be connected to the mating portion 22a of the fan 22 of another thermal device 20'. In this way, the fan 22 of the thermal device 20 could drive the fan 22 of the another thermal device 20' to rotate when the fan 22 of the thermal device 20 rotates.

As shown in FIG. 3 to FIG. 8, the fan 22 could drive another fan 22 to rotate when the driving member 12 drives the driven member 14 to drive the fan 22, which is the nearest to the driving member 12, to rotate. In this way, only one driving member 12 is required to drive the plurality of fans 22 to rotate, effectively increasing the cooling efficiency and reducing the noise of the driving member 12 during operating, reducing the energy consumption, the cost, and the overall volume of the thermal module 1 at the same time. In the current embodiment, the number of the at least one thermal device 20 is three for illustration. In practice, the number of the at least one thermal device 20 could be one or more, depending on the arrangement of a room inside the electronic device 2 or the requirement of the cooling efficiency.

The driving member 12 is a motor. The driven member 14 and the connecting portion 22b of the fan 22 are respectively a non-circular rotating shaft. The mating portion 22a of the fan 22 is a non-circular blind hole matching with a contour of the non-circular rotating shaft. In this way, the motor could drive the driven member 14 to rotate around a reference axis A to drive the fan 22 to rotate around the reference axis A. In the current embodiment, the non-circular rotating shaft and the non-circular blind hole are respectively a hexagonal shape as an example. In other embodiments, the non-circular rotating shaft and the non-circular blind hole could be respectively a triangular shape, a quadrilateral shape, a pentagonal shape, an elliptical shape, an irregular shape, or any shape which could allow the driven member 14 to be firmly connected and operatively coupled to the connecting portion 22b of the fan 22 or could allow the connecting portion 22b of the fan 22 to be firmly connected and operatively coupled to the mating portion 22a of another fan 22.

Figure 3:
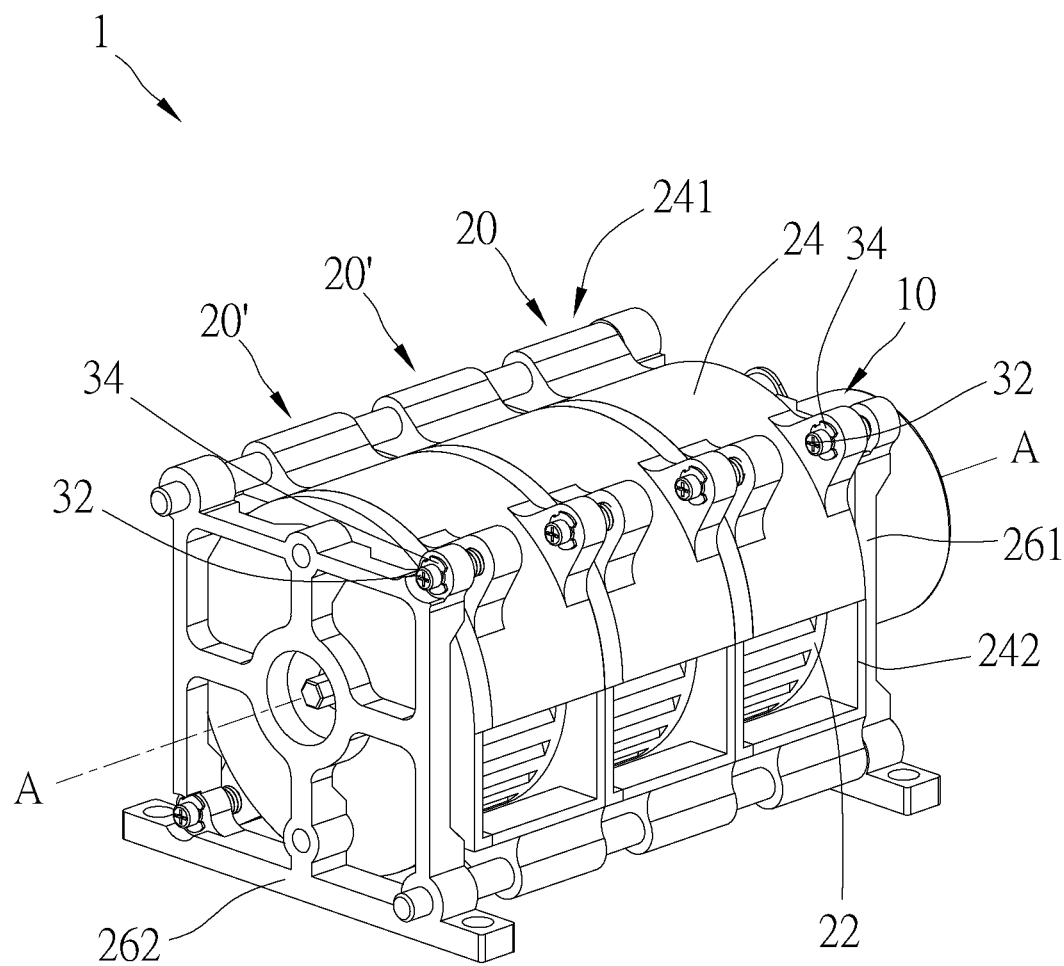
FIG. 3 is a perspective view of the thermal module according to the embodiment of the present invention.
Figure 4:
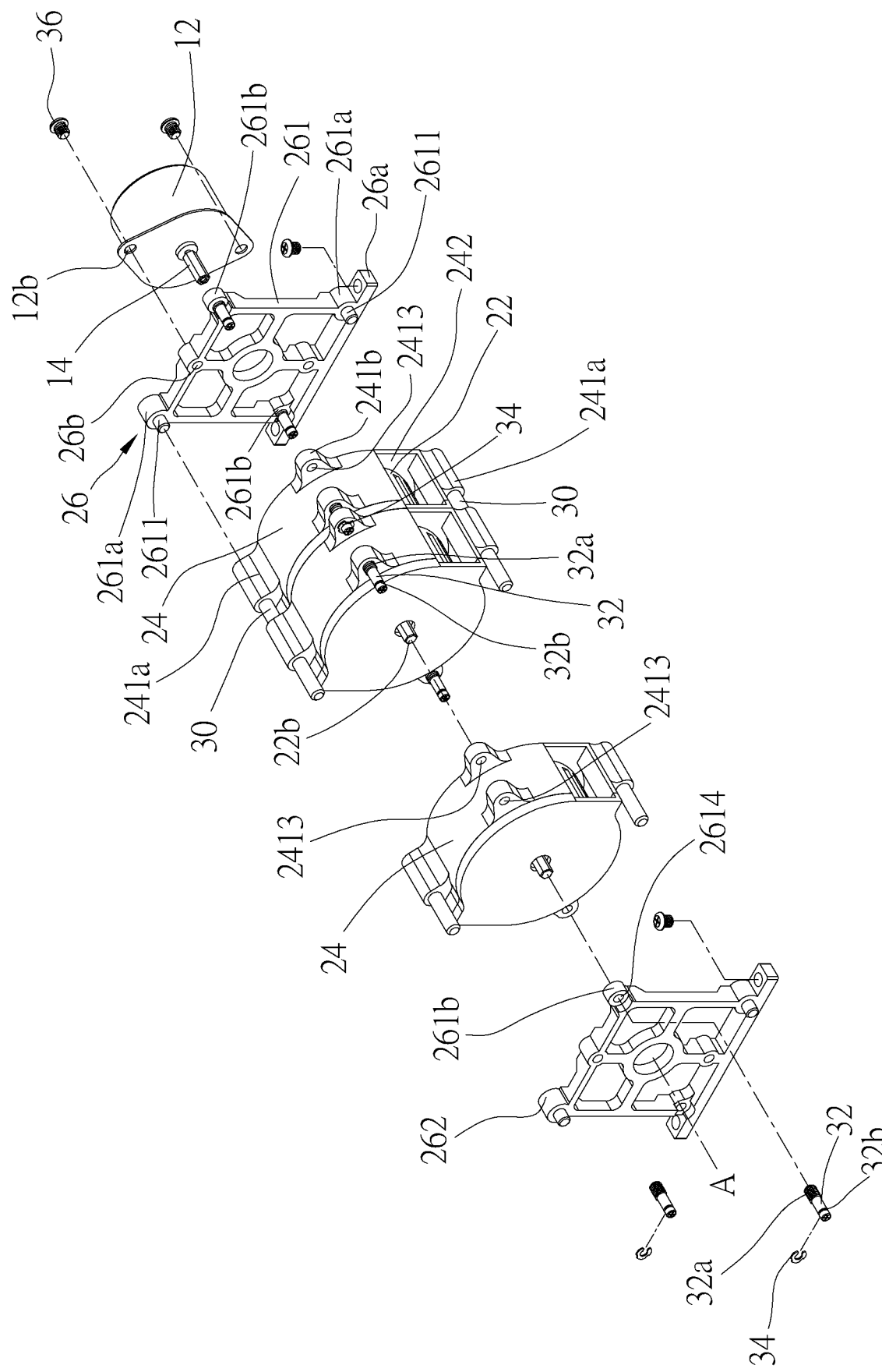
FIG. 4 is a partially exploded view of the thermal module according to the embodiment of the present invention.

Each of the thermal devices 20 includes a case 24, wherein the fan 22 is disposed in the case 24. Referring to FIG. 3, the case 24 has an engaging portion 241 for being detachably engaged with the engaging portion 241 of another case 24. As shown in FIG. 4 and FIG. 6, the engaging portion 241 of the case 24 includes two first engaging portions 241a and two second engaging portions 241b, wherein the two first engaging portions 241a of the engaging portion 241 are disposed respectively on two diagonal ends of the case 24, and the two second engaging portions 241b of the engaging portion 241 are disposed respectively on another two diagonal ends of the case 24. The two first engaging portions 241a of the engaging portion 241 respectively have a through hole 2411. When the two cases 24 of the two thermal devices 20 are disposed adjacently, the through holes 2411 of the two thermal devices 20 that are adjacent are disposed correspondingly, and are respectively passed through by a fixing column 30 which extends along a direction parallel to the reference axis A.

Each of the second engaging portions 241b of the engaging portion 241 include two engaging members 2412 which are arranged along a direction parallel to the reference axis A, wherein each of the engaging members 2412 has a screw hole 2413. When the two cases 24 of the two thermal devices 20 are disposed adjacently, a threaded rod 32 passes through the screw hole 2413 of the two engaging members 2412 which are adjacent. An end of the threaded rod 32 has an outer threaded section 32a matching with the screw hole 2413 of the engaging member 2412, and another end of the threaded rod 32 has an annular recessing groove 32b. In this way, the end of the threaded rod 32 having the outer threaded section 32a is engaged with the screw hole 2413 of one of the two engaging members 2412 that are adjacent, and another end of the threaded rod 32 having the annular recessing groove 32b passes through the screw hole 2413 of the other one of the two engaging members 2412 that are adjacent, and a C-shaped retaining ring 34 is engaged with the annular recessing groove 32b, so that the two cases 24 of the two thermal devices 20 that are adjacent could be firmly engaged together and not be loosened easily. Besides, as each of the thermal devices 20 is disposed coaxially along the reference axis A, and the two cases 24 of the two thermal devices 20 that are adjacent are disposed closely (as shown in FIG. 8), the overall volume of the thermal module 1 could be reduced.

Figure 5:
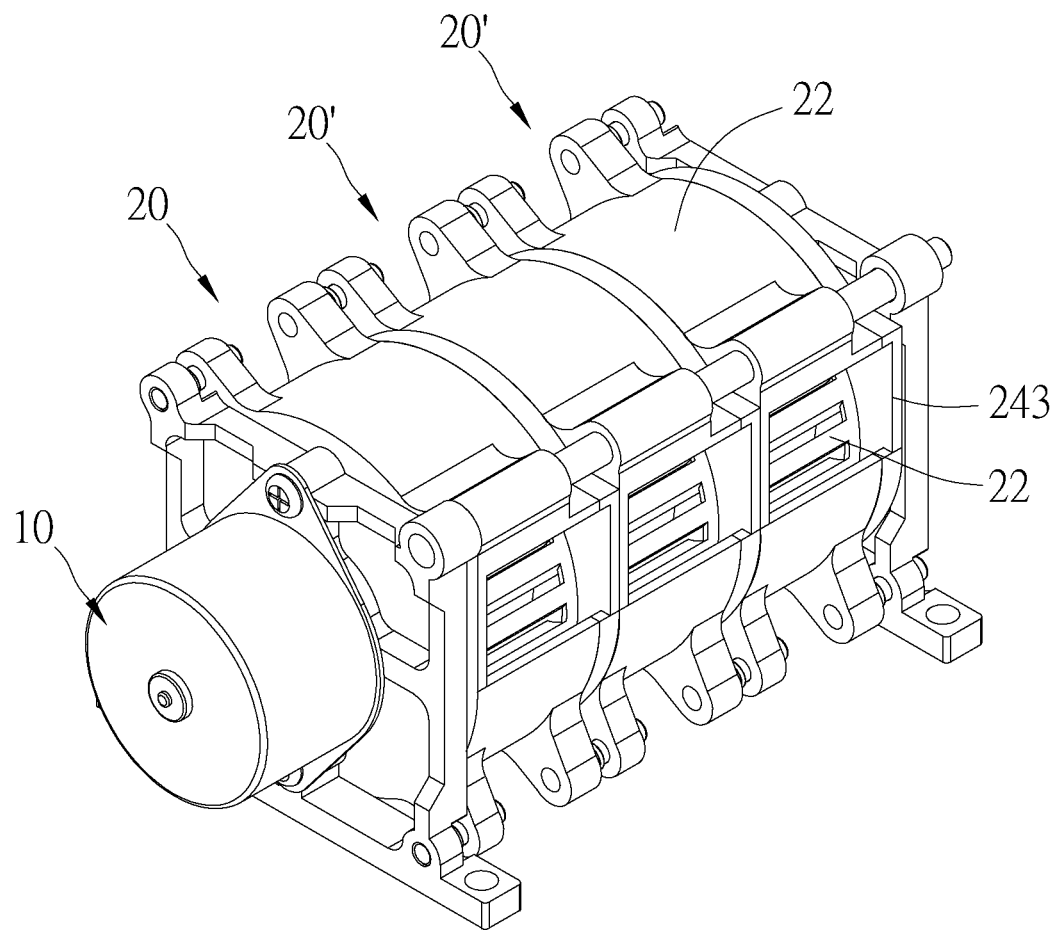
FIG. 5 is a perspective view of the thermal module according to the embodiment of the present invention seen from another direction.

As shown in FIG. 3 and FIG. 5, an air inlet 242 and an air outlet 243 are respectively disposed on two opposite sides of the case 24, wherein the air inlet 242 is closer to a bottom of the case 24 than the air outlet 243, thereby the air flow in the electronic device 2 could be guided by the fan 22 to enter the case 24 via the air inlet 242 and then exit via the air outlet 243 (as shown in FIG. 7).

Each of the thermal devices 20 includes at least one frame 26, wherein the at least one frame 26 has a fixing portion 26a. The driving device 10 is detachably engaged with the at least one frame 26, and the at least one thermal device 20 is detachably engaged with the at least one frame 26. The at least one frame 26 is fixed on an installation surface of the electronic device 2 via the fixing portion 26a. The driving device 10 and the at least one thermal device 20 are disposed above the installation surface by a distance via the at least one frame 26.

Referring to FIG. 4, in the current embodiment, the number of the at least one frame 26 is plural, and the at least one frame 26 includes a front-end frame 261 and a rear-end frame 262. The driving device 10, the front-end frame 261, the thermal devices 20, and the rear-end frame 262 are disposed in order along the reference axis A. In other embodiments, the front-end frame 261 could be disposed alone, and the rear-end frame 262 could be omitted.

As shown in FIG. 4, the front-end frame 261 includes two screw holes 26b, wherein the driving member 12 has two through holes 12b corresponding to the two screw holes 26b of the front-end frame 261. In this way, the driving member 12 could be fixed on the front-end frame 261 via two screws 36 matching with the two screw holes 26b of the front-end frame 261 and the two through holes 12b of the driving member 12. Besides, the front-end frame 261 includes two first engaging portions 261a and two second engaging portions 261b, wherein the two first engaging portions 261a of the front-end frame 261 are disposed respectively on two diagonal ends of the front-end frame 261, and the two second engaging portions 261b of the front-end frame 261 are disposed respectively on another two diagonal ends of the front-end frame 261. The two first engaging portions 261a of the front-end frame 261 respectively have a protruding column 2611 extending along a direction parallel to the reference axis A, wherein when the front-end frame 261 is disposed on a side of the case 24 of the thermal device 20, each of the protruding columns 2611 passes through one of the through holes 2411 of the case 24 (as shown in FIG. 6). As shown in FIG. 6, each of the second engaging portions 261*b* of the front-end frame 261 has a screw hole 2614, wherein when the front-end frame 261 is disposed on the side of the case 24 of the thermal device 20, a threaded rod 32 could pass through the screw hole 2413 of the case 24 and the screw hole 2614 of the second engaging portion 261*b* of the front-end frame 261. In this way, the end of the threaded rod 32 having the outer threaded section 32*a* is engaged with the screw hole 2614 of the second engaging portion 261*b* of the front-end frame 261, and the another end of the threaded rod 32 having the annular recessing groove 32*b* passes through the screw hole 2413 of the case 24, and a C-shaped retaining ring 34 is engaged with the annular recessing groove 32*b* (as shown in FIG. 3), thereby the thermal device 20 could be firmly engaged with the front-end frame 261 and not be loosened easily.

As shown in FIG. 4, the structure of the rear-end frame 262 is the same as that of the front-end frame 261. When the rear-end frame 262 is disposed on another side of the case 24 of the thermal device 20, two ends of a threaded rod 32 respectively pass through the screw hole 2413 of the case 24 and the screw hole 2614 of the second engaging portion 261*b* of the rear-end frame 262. An end of the threaded rod 32 having the outer threaded section 32*a* is engaged with the screw hole 2413 of the case 24, and another end of the threaded rod 32 having the annular recessing groove 32*b* passes through the screw hole 2614 of the second engaging portion 261*b* of the rear-end frame 262, and a C-shaped retaining ring 34 is engaged with the annular recessing groove 32*b*, thereby the thermal device 20 could be firmly engaged with the rear-end frame 262 and not be loosened easily. As shown in FIG. 6, the two first engaging portion 261*a* of the rear-end frame 262 respectively have a recessing groove 2613 disposed on a rear side of the protruding column 2611. In this way, when the rear-end frame 262 is disposed on the another side of the case 24 of the thermal device 20, each of the recessing grooves 2613 and the through hole 2411 of the case 24 are respectively passed through by two ends of a fixing column 30, wherein the two ends of the fixing column 30 are located between each of the recessing grooves 2613 and the through hole 2411 of the case 24.

A thermal module 3 according to another embodiment of the present invention is illustrated in FIG. 9 to FIG. 13, which has almost the same structure as that of the thermal module 1 of the aforementioned embodiment, except that each of the cases 24 has an end surface 244 perpendicular to the reference axis A, wherein the air inlet 242 is disposed on the end surface 244, and the air outlet 243 is disposed on a side surface of the case 24. The number of the at least one frame 26 is plural, and the frames 26 include a front-end frame 261 and at least one middle frame 263. The structure of each of the middle frames 263 is the same as that of the front-end frame 261, and each of the middle frames 263 is disposed between the two thermal devices 20 that are adjacent, so that the two thermal devices 20 that are adjacent are spaced by an interval. In this way, the air flow in the electronic device 2 could be guided by each of the fans 22 to enter each of the cases 24 via each of the air inlets 242 and exit via each of the air outlets 243.

In the current embodiment, the thermal module 3 includes a plurality of adapters 40 respectively disposed between any two of the fans 22 that are adjacent and between the driven member 14 of the driving device 10 and one of the fans 22. Two opposite sides of the adapters 40 respectively have a non-circular rotating shaft and a non-circular blind hole, wherein the non-circular rotating shaft of the adapters 40 is adapted to pass through the mating portion 22*a* of one of the fans 22, and the non-circular blind hole of the adapters 40 is adapted to be passed through by the connecting portion 22*b* of another fan 22 or the driven member 14. In this way, the driven member 14 could be operatively coupled to one of the fans 22 via the adapters 40, and the two fans 22 that are adjacent could be operatively coupled via the adapters 40.

With the aforementioned design, the fan 22 of the plurality of thermal devices 20 could be driven to rotate by simply one driving member 12, increasing the cooling efficiency. Besides, when installing the plurality of thermal devices, compared with the conventional thermal device in which one driving member drives one fan, the plurality of fans 22 of the thermal module of the present invention driven by one driving member 12 could effectively reduce the noise of the driving member 12 during operating, and the energy consumption and the overall volume of the thermal module could also be reduced.

It must be pointed out that the embodiments described above are only some preferred embodiments of the present invention. All equivalent structures which employ the concepts disclosed in this specification and the appended claims should fall within the scope of the present invention.

What is claimed is:

1. A thermal module for being disposed in an electronic device, comprising:
   a driving device comprising a driving member and a driven member which are connected together, wherein the driving member is adapted to drive the driven member to operate; and
   at least one thermal device, wherein the at least one thermal device comprises a fan; two opposite ends of the fan respectively have a mating portion and a connecting portion; the mating portion is adapted to be connected to the driven member, so that the driving member drives the driven member to drive the fan to rotate;
   wherein the connecting portion of the fan is adapted to be connected to a mating portion of a fan of another thermal device, so that when the driving member drives the fan of the at least one thermal device to rotate, the fan of the at least one thermal device drives the fan of the another thermal device to rotate;
   wherein the at least one thermal device comprises a case; the fan is disposed in the case; the case has an engaging portion adapted to be detachably engaged with an engaging portion of another case.

2. The thermal module as claimed in claim 1, wherein the driven member of the driving device and the connecting portion of the fan of the at least one thermal device are respectively a non-circular rotating shaft; the mating portion of the fan of the at least one thermal device is a non-circular blind hole matching with a contour of the non-circular rotating shaft.

3. The thermal module as claimed in claim 1, wherein two opposite sides of the case respectively have an air inlet and an air outlet, thereby an air flow in the electronic device is guided by the fan to enter the case via the air inlet and exit via the air outlet.

4. The thermal module as claimed in claim 3, wherein the fan rotates around a reference axis; the at least one thermal device comprises a plurality of thermal devices disposed coaxially along the reference axis; the cases of the two thermal devices that are adjacent abut against each other.

5. The thermal module as claimed in claim 1, wherein the case has an air inlet and an air outlet; the fan rotates around a reference axis; the case has an end surface perpendicular to the reference axis; the air inlet is disposed on the end surface; an air flow in the electronic device is guided by the fan to enter the case via the air inlet and exit via the air outlet.

6. The thermal module as claimed in claim 5, wherein the at least one thermal device comprises a plurality of thermal devices disposed coaxially along the reference axis, and the cases of the two thermal devices that are adjacent are spaced by an interval.

7. A thermal module for being disposed in an electronic device, comprising:
- a driving device comprising a driving member and a driven member which are connected together, wherein the driving member is adapted to drive the driven member to operate; and
- at least one thermal device, wherein the at least one thermal device comprises a fan; two opposite ends of the fan respectively have a mating portion and a connecting portion; the mating portion is adapted to be connected to the driven member, so that the driving member drives the driven member to drive the fan to rotate;
- wherein the connecting portion of the fan is adapted to be connected to a mating portion of a fan of another thermal device, so that when the driving member drives the fan of the at least one thermal device to rotate, the fan of the at least one thermal device drives the fan of the another thermal device to rotate;
- wherein the at least one thermal device comprises at least one frame; the at least one frame has a fixing portion; the driving device is detachably engaged with the at least one frame; the at least one thermal device is detachably engaged with the at least one frame; the at least one frame is fixed on an installation surface of the electronic device via the fixing portion; the driving device and the at least one thermal device are disposed above the installation surface by a distance via the at least one frame.

8. The thermal module as claimed in claim 7, wherein the at least one frame comprises a plurality of frames comprising a front-end frame and a rear-end frame; the fan rotates around a reference axis; the driving device, the front-end frame, the at least one thermal device, and the rear-end frame are disposed in order along the reference axis.

9. The thermal module as claimed in claim 7, wherein the at least one frame comprises a plurality of frames comprising at least one middle frame; the at least one thermal device comprises a plurality of thermal devices; the at least one middle frame is disposed between any two of the thermal devices that are adjacent, thereby any two of the thermal devices that are adjacent are spaced by an interval.

* * * * *